United States Patent
Ebata et al.

(10) Patent No.: US 8,360,129 B2
(45) Date of Patent: Jan. 29, 2013

(54) PEELING DEVICE

(75) Inventors: Kenichi Ebata, Tokyo (JP); Yasunori Ito, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/096,006

(22) Filed: Apr. 28, 2011

(65) Prior Publication Data

US 2011/0198040 A1 Aug. 18, 2011

Related U.S. Application Data

(63) Continuation of application No. PCT/JP2010/063946, filed on Aug. 18, 2010.

(30) Foreign Application Priority Data

Aug. 31, 2009 (JP) ................................. 2009-200914

(51) Int. Cl.
*B29C 63/00* (2006.01)
(52) U.S. Cl. .......................... 156/764; 156/714; 156/766
(58) Field of Classification Search .................. 156/714, 156/764, 766
See application file for complete search history.

(56) References Cited

U.S. PATENT DOCUMENTS 5,989,386 A * 11/1999 Elliott ............................ 156/707
7,740,735 B2 * 6/2010 Kerdiles et al. ............... 156/707

FOREIGN PATENT DOCUMENTS

| JP | 5-58485 | 3/1993 |
|----|---------|--------|
| JP | 6-48679 | 2/1994 |
| JP | 2000-84844 | 3/2000 |
| JP | 2004-142878 | 5/2004 |
| JP | 2007-39214 | 2/2007 |
| JP | 2007-185725 | 7/2007 |
| WO | 2008/007622 | 1/2008 |

OTHER PUBLICATIONS

International Search Report issued Nov. 20, 2010, in PCT/JP2010/063946 filed Nov. 16, 2010.
Microfilm of the specification and drawings annexed to the request of Japanese Utility Model Application No. 54131/1986 (Laid-open No. 171744/1986).

* cited by examiner

*Primary Examiner* — Mark A Osele
*Assistant Examiner* — Nickolas Harm
(74) *Attorney, Agent, or Firm* — Oblon, Spivak, McClelland, Maier & Neustadt, L.L.P.

(57) ABSTRACT

The present invention relates to a peeling device which peels off a reinforcing sheet stuck on a substrate, including: a supporting unit which supports one main surface of a laminate having the substrate and the reinforcing sheet; a plate-shaped flexible member to be attached to the other main surface of the laminate; a plurality of pads fixed to a surface of the flexible member lying opposite to the laminate side; a plurality of rods each of which is coupled to any one of the plurality of pads; a plurality of driving devices by which the plurality of rods are made to move, respectively, in their individual axial directions; and a control device by which a position of each of the plurality of rods is controlled on an individual basis, in which each of the plurality of pads is coupled to any one of the plurality of the rods via any one of a plurality of joints so that each pad is allowed to be pivotable centering on a vicinity of an intersection point of a centerline of the rod coupled thereto with a surface of the reinforcing sheet facing the substrate side or a surface of the substrate facing the reinforcing sheet side, and in which the one main surface of the laminate is supported by the supporting unit, and at the same time, the position of each of the plurality of rods is controlled by the control device so that the other main surface of the laminate is subjected to bending deformation in sequence from one-end side thereof.

16 Claims, 9 Drawing Sheets

PEELING DEVICE

TECHNICAL FIELD

The present invention relates to a peeling device which peels off a reinforcing sheet stuck on a substrate.

BACKGROUND ART

In recent years, efforts have been moving ahead to reduce thickness and weights of electronic devices, such as display panels, solar cells and thin-film secondary batteries, and thickness reductions of glass substrates used in those electronic devices have been progressing. When the strength of a glass substrate is lowered by reduction in thickness of the glass substrate, handling property of the glass substrate is depressed, and therefore it becomes difficult to form electronic device members (e.g. thin-film transistors and color filters) on the glass substrate.

In relation to such recent trends, the laminate of a glass substrate and a reinforcing sheet attached thereto in a separable condition is disclosed in Patent Document 1. After formation of electronic device members on the side of the glass substrate lying opposite to the reinforcing sheet side, the reinforcing sheet attached to the glass substrate is separated from the glass substrate. In this manner, the glass substrate can be compensated for the strength reduction.

In addition, Patent Document 1 has such a description that, in order to peel off the reinforcing sheet attached to a glass plate, initial peeling is carried out by inserting a razor blade or the like between the glass substrate and the reinforcing sheet. By carrying out the initial peeling, it becomes possible to easily perform the subsequent peeling.

On the other hand, as a peeling device for peeling off a glass substrate attached to an adsorbing member, Patent Document 2 proposes the device for peeling off a glass substrate by attaching a plate-shaped flexible member to the glass substrate, fixing plural rods on the flexible member, and allowing each rod to elongate and contract in its individual axial direction so that the glass substrate is subjected to sequential bending deformation from the both ends thereof.

In addition, as a peeling device for peeling off a reinforcing sheet attached to a resin substrate, Patent Document 3 discloses the device structured to sequentially bring the curved surface of a rotating body into contact with the upper surface of a reinforcing sheet while turning the rotating body to thereby sequentially cause bending deformation in contacted areas of the reinforcing sheet and peel off the reinforcing sheet.

BACKGROUND ART DOCUMENT

Patent Documents

Patent Document 1: WO 08/007,622 pamphlet
Patent Document 2: JP-A-2000-84844 gazette
Patent Document 3: JP-A-2004-142878 gazette

SUMMARY OF THE INVENTION

Problems that the Invention is to Solve

Patent Document 1 is silent on concrete explanations for methods of peeling operation subsequent to the initial peeling. Thus it is conceivable to utilize the peeling device disclosed in Patent Document 2 as a method of peeling operation subsequent to the initial peeling. For instance, it is supposed that a plate-shaped flexible member is attached to a reinforcing sheet, plural rods are fixed on the flexible member and made to elongate and contract in their individual axial directions so that the reinforcing sheet is subjected to sequential bending deformation from the one-end side (i.e., the position at which it is subjected to the initial peeling), thereby peeling off the reinforcing sheet.

However, each rod in the peeling device disclosed in Patent Document 2 cannot move in directions orthogonal to its axial direction, and therefore, bending deformation of the reinforcing sheet may be inhibited. When the bending deformation of the reinforcing sheet is small, the reinforcing sheet and the substrate are separated in a state of being almost parallel to each other, and therefore, the force required for peeling becomes great, and the peeling becomes difficult. Such being the case, when the reinforcing sheet includes a resin layer and the resin layer is closely attached to the substrate, there is a fear that the resin layer causes aggregation fracture at the time of peeling to result in adhesion of the resin layer to the substrate.

On the other hand, in the device disclosed in Patent Document 3, the extent of bending deformation of the reinforcing sheet is determined by the shape of curved surface of the rotating body, and therefore, changes in objects to be peeled off are difficult to address.

The invention has been made in view of these problems, and an object thereof is to provide a peeling device that allows a reinforcing sheet stuck on a substrate to be easily peeled off and that can easily respond to changes in objects to be peeled off.

Means for Solving the Problems

In order to attain a solution to the challenge, the present invention relates to a peeling device which peels off a reinforcing sheet stuck on a substrate, comprising:

a supporting unit which supports one main surface of a laminate having the substrate and the reinforcing sheet;

a plate-shaped flexible member to be attached to the other main surface of the laminate;

a plurality of pads fixed to a surface of the flexible member lying opposite to the laminate side;

a plurality of rods each of which is coupled to any one of the plurality of pads;

a plurality of driving devices by which the plurality of rods are made to move, respectively, in their individual axial directions; and a control device by which a position of each of the plurality of rods is controlled on an individual basis, wherein each of the plurality of pads is coupled to any one of the plurality of the rods via any one of a plurality of joints so that each pad is allowed to be pivotable centering on a vicinity of an intersection point of a centerline of the rod coupled thereto with a surface of the reinforcing sheet facing the substrate side or a surface of the substrate facing the reinforcing sheet side, and wherein the one main surface of the laminate is supported by the supporting unit, and at the same time, the position of each of the plurality of rods is controlled by the control device so that the other main surface of the laminate is subjected to bending deformation in sequence from one-end side thereof.

In addition, the present invention also relates to a peeling device which peels off a reinforcing sheet stuck on a substrate, comprising:

a plate-shaped flexible member to be attached to each of both main surfaces of a laminate having the substrate and the reinforcing sheet;

a plurality of pads fixed to a surface of each flexible member lying opposite to the laminate side;

a plurality of rods each of which is coupled to any one of the plurality of pads;

a plurality of driving devices by which the plurality of rods are made to move, respectively, in their individual axial directions; and a control device by which a position of each of the plurality of rods is controlled on an individual basis, wherein each of the plurality of pads is coupled to any one of the plurality of the rods via any one of a plurality of joints so that each pad is allowed to be pivotable centering on a vicinity of an intersection point of a centerline of the rod coupled thereto with a surface of the reinforcing sheet facing the substrate side or a surface of the substrate facing the reinforcing sheet side, and wherein the position of each of the plurality of rods is controlled by the control device so that the one main surface of the laminate is subjected to bending deformation in sequence from one-end side thereof, and the position of each of the plurality of rods is controlled by the control device so that the other main surface is subjected to bending deformation in sequence from the one-end side thereof.

Advantages of the Invention

According to the invention, it is possible to provide a peeling device that allows a reinforcing sheet stuck on a substrate to be easily peeled off and that can easily respond to changes in objects to be peeled off.

MODE FOR CARRYING OUT THE INVENTION

Modes for carrying out the invention are described below by reference to the drawings.

First Embodiment

Figure 1:
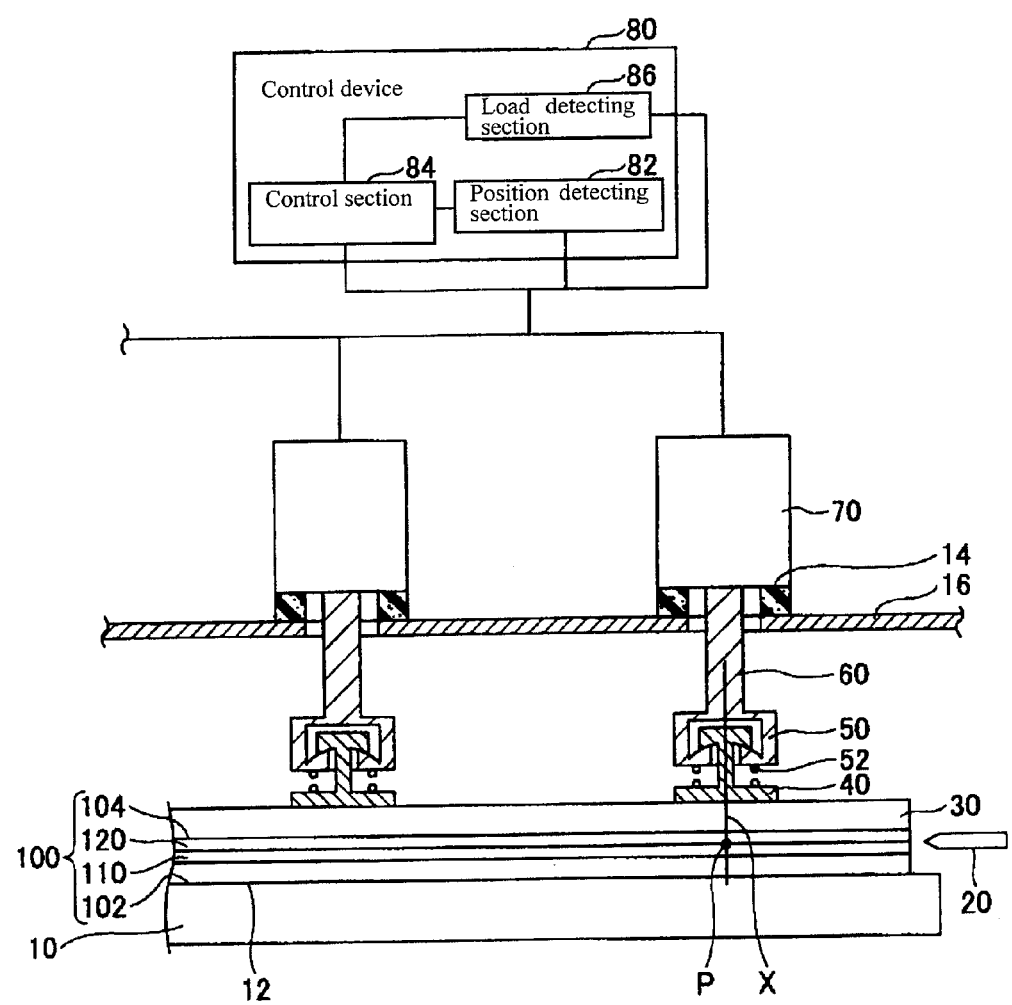
FIG. 1 is a partial cross-sectional side view showing a peeling device in a first embodiment of the invention.
Figure 2:
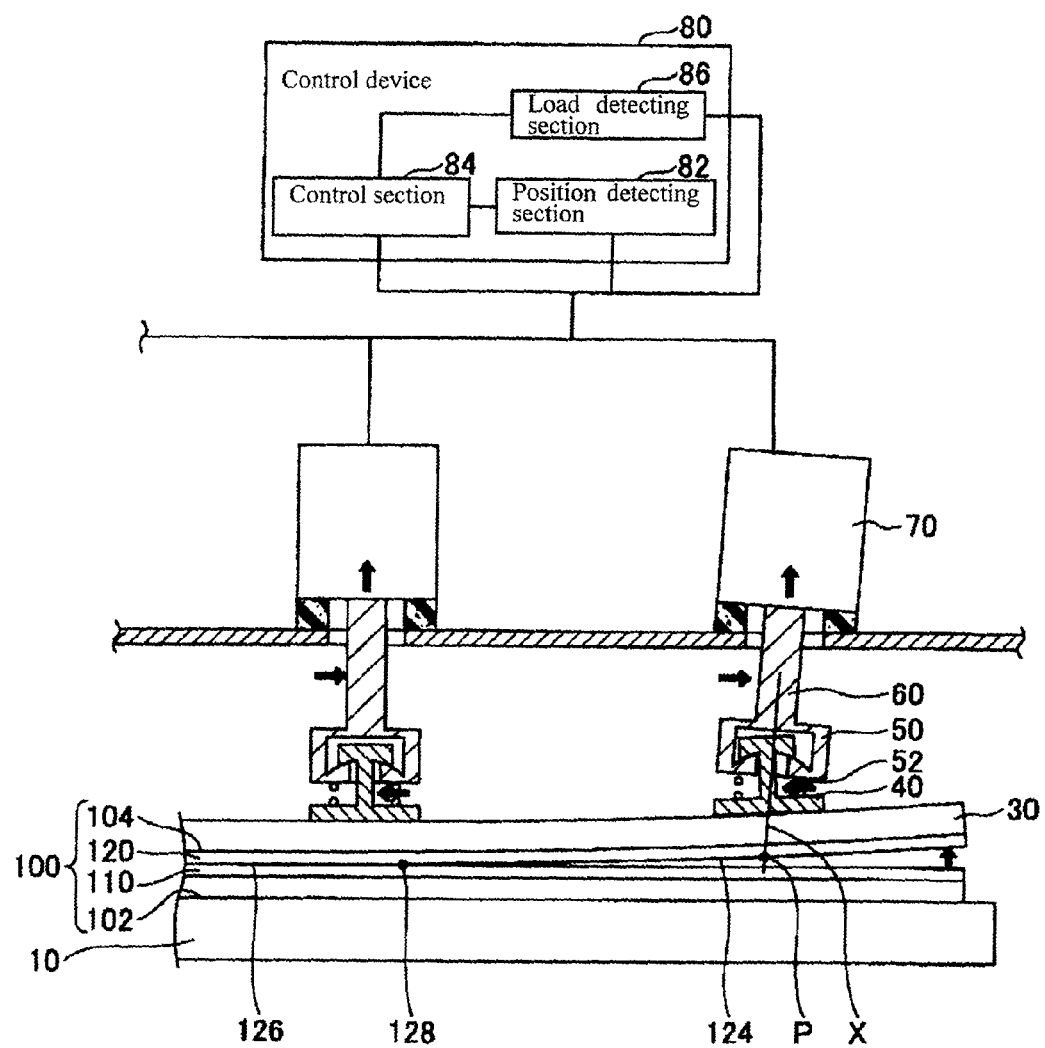
FIG. 2 is a partial cross-sectional side view illustrating movements in the peeling device of FIG. 1.

FIG. 1 is a partial cross-sectional side view showing a peeling device in a first embodiment. And FIG. 2 is a partial cross-sectional side view illustrating movements in the peeling device of FIG. 1.

The peeling device is a device which peels off a reinforcing sheet 120 stuck on a glass substrate 110. While supporting the first main surface 102 of a laminate 100 having the glass substrate 110 and the reinforcing sheet 120, the peeling device bends and deforms the second main surface 104 of the laminate 100 in sequence from one-end side thereof. In this manner, the peeling device peels off the reinforcing sheet 120 by sequential bending deformation from one-end side thereof while holding the glass substrate 110 in a flat state.

Although the peeling device in this embodiment is structured to peel off the reinforcing sheet 120 by sequential bending deformation from one-end side thereof while holding the glass substrate 110 in a flat state, the invention is not limited to the peeling device of such a structure. For instance, the peeling device may be structured to peel off the glass substrate 110 by sequential bending deformation from one-end side thereof while holding the reinforcing sheet 120 in a flat state.

Next, the laminate 100 is illustrated.

The laminate 100 has at least the glass substrate 110 and the reinforcing sheet 120. On the side of the glass substrate 110 lying opposite to the reinforcing sheet 120 side, a member for electronic devices may be formed as mentioned above.

The term "electronic devices" used herein refers to the electronic components, such as display panels, solar cells and thin-film secondary batteries. The display panels include liquid-crystal panels such as TFT-LCD and STN-LCD, organic EL panels, plasma display panels and field-emission panels.

The glass substrate 110 may be a non-alkali glass substrate, or it may be an alkali glass substrate. The glass substrate 110 is selected as appropriate on the basis of an electronic device applied thereto and its fabrication process, but a non-alkali glass substrate is preferably selected as the glass substrate 110 because of its low heat-shrinkage ratio.

The thickness of the glass substrate 110, though not particularly limited, is preferably 0.3 mm or less, more preferably 0.15 mm or less, from the viewpoint of reduction in sheet thickness. When the thickness thereof is 0.3 mm or less, the glass substrate 110 can have satisfactory flexibility. And the glass substrate 110 having a thickness of 0.15 mm or less can be wound into a roll.

For the purpose of inhibiting warpage and delamination of the reinforcing sheet 120 from occurring at the time of heating or cooling, it is preferable that the difference between linear expansion coefficients of the reinforcing sheet 120 and the glass substrate 110 is small in absolute value. And it is preferable that the reinforcing sheet 120 includes at least a glass sheet. The glass sheet may be formed with the same material as the glass substrate 110, or it may be formed with a material different from the material of the glass substrate 10. However, it is preferable that they are formed with the same material.

Figure 3:
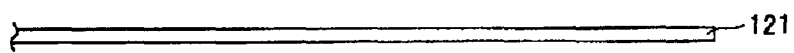
FIG. 3 is a side view showing an example of a reinforcing sheet 120.

FIG. 3 is a side view showing an example of the reinforcing sheet 120.

In the example FIG. 3 shows, the reinforcing sheet 120 is made up of a glass sheet 121 alone. In this case, the reinforcing sheet 121 can be stuck on the glass substrate 110 in a peelable condition by bonding force between silanol groups (Si-OH), Van der Waals attraction and so on.

Figure 4:
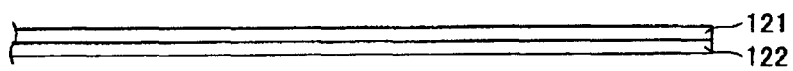
FIG. 4 is a side view showing an example of a variation of FIG. 3.

FIG. 4 is a side view showing an example of a variation of FIG. 3.

In the example FIG. 4 shows, the reinforcing sheet 120 is made up of a glass sheet 121 and a resin layer 122 formed on the glass sheet 121. In this case, the resin layer 122 can be stuck on the glass substrate 110 in a peelable condition by Van der Waals attraction between the resin layer 122 and the glass substrate 110, a pressure-sensitive adhesive force of the resin layer 122 and so on.

From the viewpoints of flexibility and impact resistance, it is preferable that the resin layer 122 contain at least one kind of resin selected from acrylic resins, polyolefin resins, epoxy resins, polyurethane resins and silicone resins. In view of heat resistance also, it is preferable that the resin layer 122 contains a silicone resin.

Additionally, although the reinforcing sheet 120 is made up of the glass sheet 121 and the resin layer 122 in the example shown in FIG. 4, another resin layer may further be formed on the side of the glass sheet 121 lying opposite to the resin layer 122 side.

Figure 5:
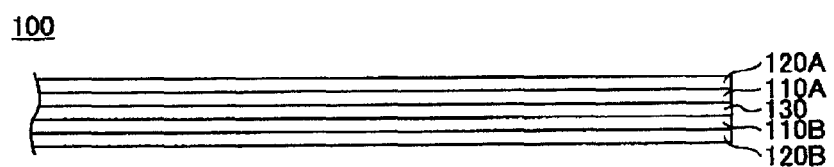
FIG. 5 is a side view showing an example of a laminate 100.

FIG. 5 is a side view showing an example of a laminate 100.

In the example FIG. 5 shows, the laminate 100 has a structure that a reinforcing sheet 120A, a glass substrate 110A, a liquid-crystal layer 130, a glass substrate 110B and a reinforcing sheet 120B are stacked on top of each other in the order of mention. This laminate 100 is a laminate for use in TFT-LCD and, on the surface of the glass substrate 110A facing the liquid-crystal layer 130, thin-film transistors (TFTs) which are not illustrated in FIG. 5 are formed, while color filters which are not illustrated in FIG. 5 are formed on the surface of the glass substrate 110B facing the liquid-crystal layer 130.

Alternatively, the laminate 100, although structured to place reinforcing sheets on both sides in the example shown in FIG. 5, may be structured to place a reinforcing sheet on one side alone.

Then, details of the peeling device are described in referring to FIG. 1 and FIG. 2 again.

The peeling device includes a stage 10 (a supporting unit), a peeling blade 20, a flexible member 30, plural pads 40, plural joints 50, plural rods 60, plural driving devices 70, a control device 80.

The stage 10 supports the first main surface 102 of the laminate 100 and holds the glass substrate 110 in a flat state.

Alternatively, the stage 10, although configured to support the first main surface 102 of the laminate 100 and hold the glass substrate 110 in a flat state in this embodiment, may be configured to support the second main surface 104 of the laminate 100 and hold the reinforcing sheet 120 in a flat state.

The stage 10 is vacuum-adsorbed to the first main surface 102 of the laminate 100. Incidentally, instead of being vacuum-adsorbed, the stage 10 may be attached by electrostatic adsorption or adhered with a removable adhesive.

The peeling blade 20 is used for carrying out initial peeling, and it is inserted between the glass substrate 110 and the reinforcing sheet 120 manually or with an appropriate driving device. For instance, the peeling blade 20 is inserted between the glass substrate 110 and the reinforcing sheet 120 on an edge part of the laminate 100 and made to move a given distance along the interface between the glass substrate 110 and the reinforcing sheet 120.

Figure 6:
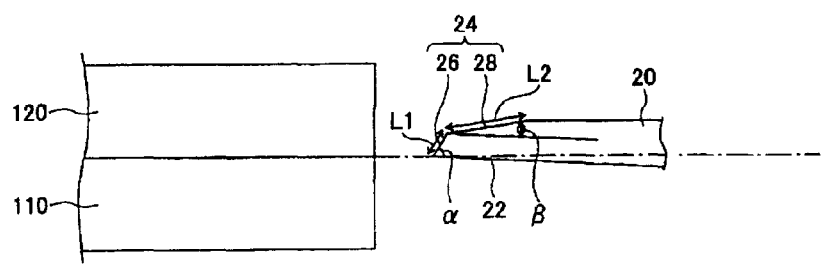
FIG. 6 is a side view showing an example of a peeling blade 20.

FIG. 6 is a side view showing an example of the peeling blade 20.

In a tip portion of the peeling blade 20, the blade surface 22 on the glass substrate 110 side, as shown in FIG. 6, is designed to deviate increasingly from the glass substrate 110 with decrease in distance to the tip. By doing so, damage of the glass substrate 110 caused by insertion of the peeling blade 20 can be suppressed.

Likewise, the tip portion of the peeling blade 20 is designed so that the blade surface 24 on the reinforcing sheet 120 side deviates increasingly from the reinforcing sheet 120 with decrease in distance to the tip. By doing so, damage of the reinforcing sheet 120 caused by insertion of the peeling blade 20 can be suppressed. When the reinforcing sheet 120 includes a resin layer 122, and besides, the resin layer 122 closely contacts with the glass substrate 110, adoption of such a design for the peeling blade 20 is especially effective because the resin layer 122 is low in scratch resistance as compared with the glass sheet 121.

In the example shown in FIG. 6, the blade surface 24 on the reinforcing sheet 120 side is formed of two inclined surfaces 26 and 28. The angle α which the blade surface 22 forms with the inclined surface 26 is set at 65°, while the angle β which the blade surface 22 forms with the inclined surface 28 is set at 12°. The length L1 of the inclined surface 26 is set at 35 μm and the length L2 of the inclined surface 28 is set at 290 μm.

The flexible member 30 has the shape of a plate, and it is a member to be attached to the second main surface 104 of the laminate 100. In other words, the flexible member 30 is a member to be attached to the surface 104 of the reinforcing sheet 120 lying opposite to the glass substrate 110 side. And the flexible member 30 may be attached to the second main surface 104 of the laminate 100 in a detachable condition.

Alternatively, the flexible member 30, though attached to the second main surface 104 of the laminate 100 in this embodiment, may be attached to the first main surface 102 of the laminate 100.

In the case where pads 40 mentioned later are attached directly to the second main surface 104 of the laminate 100 without interposition of the flexible member 30, the reinforcing sheet 120 and the glass substrate 110 are separated in a nearly parallel state at positions directly underneath the pads 40 when motions of the pads 40 are started, and therefore, the force required for peeling becomes great and the peeling becomes difficult to perform. Thus, when the reinforcing sheet 120 includes the resin layer 122, and besides, the resin layer 122 and the glass substrate 110 are closely contact with each other, there is a fear that the resin layer 122 causes aggregation fracture at the time of peeling to result in adhesion of the resin layer 122 to the glass substrate 110.

Figure 7A:
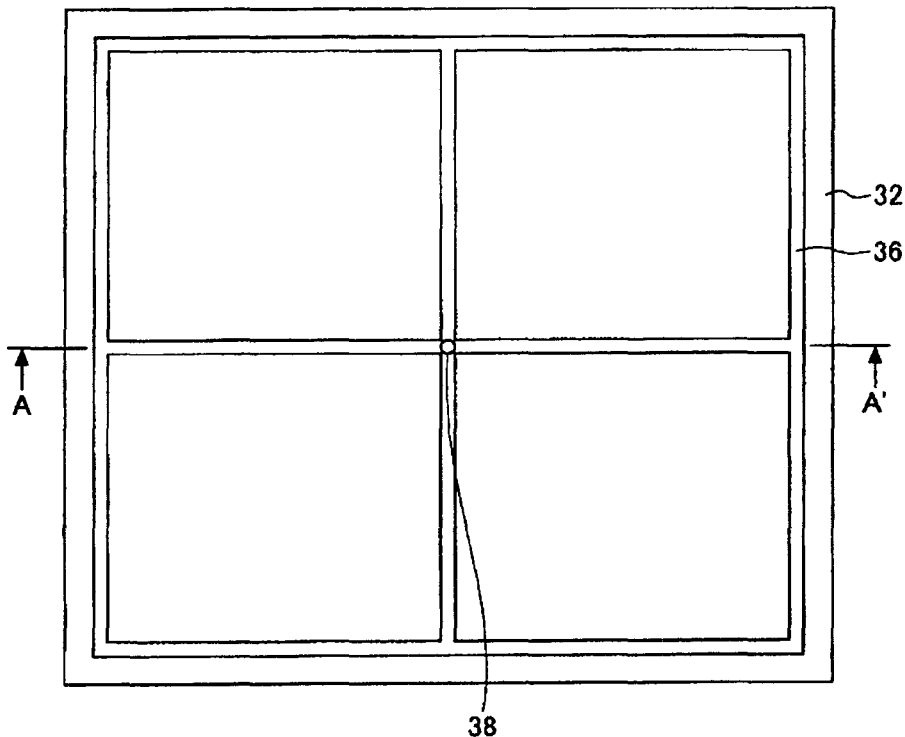
FIGS. 7(a) and 7(b) are overall views showing an example of a flexible member 30.
Figure 7B:
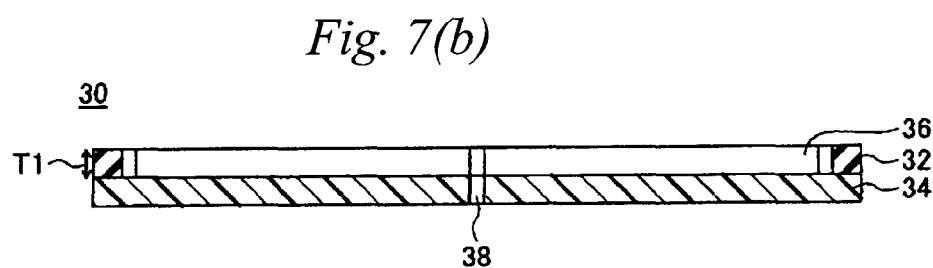

FIG. 7 are overall views showing an example of the flexible member 30, in which FIG. 7(a) is a plan view of the member 30 and FIG. 7(b) is a cross-section view appearing if the member 30 is cut along the A-A' line in FIG. 7(a).

In the example shown in FIG. 7, the flexible member 30 includes an attachment portion 32 and a specification portion 34. The attachment portion 32 is a section to be attached to the second main surface 104 of the laminate 100 in a detachable condition. In the attachment portion 32, a groove 36 is formed, and the groove 36 is communicated with a through-hole 38 of the specification portion 34. By reducing an internal pressure of the groove 36 by a vacuum pump or the like connected to the through-hole 38, the attachment portion 32 is vacuum-adsorbed to the second main surface 104 of the laminate 100. Alternatively, electrostatic adsorption or adhesion in a removable condition may be adopted instead of vacuum adsorption.

The attachment portion 32 has no particular restriction on the material thereof, but the material is preferably rubber in view of close-adhesiveness. As for rubber, silicone rubber is preferred in view of detachability. Instead of using silicone rubber, silicone gel can be used. In this case, however, aggregation fracture of silicone gel and the resulting silicone gel adhesion to the laminate 100 may occur at the time of detachment of the attachment portion 32.

For the purpose of enhancing detachability, a coating may be applied to the surface of the attachment portion 32.

The thickness T1 of the attachment portion 32 is preferably 1 mm or more, more preferably 2 mm or more. When the thickness T1 of the attachment portion 32 is less than 1 mm, the deformation allowance of the attachment portion 32 is small, and therefore it becomes difficult to secure sufficient adhesion between the attachment portion 32 and the laminate 100. In addition, the thickness T1 of the attachment portion 32 is preferably 30 mm or less. When the thickness T1 of the attachment portion 32 exceeds 30 mm, the deformation allowance of the attachment portion 32 is great, and therefore it becomes difficult to control bending deformation of the second main surface 104 of the laminate 100.

The specification portion 34 is a section for specifying the flexural rigidity of the flexible member 30. The flexural rigidity of the flexible member 30 per unit width (1 mm) is preferably from 1,000 N·mm²/mm to 40,000 N·mm²/mm. In other words, the flexural rigidity of the flexible member 30 is preferably from 1,000 N·mm² to 40,000 N·mm².

When the flexural rigidity of the flexible member 30 per unit width (1 mm) is less than 1,000 N·mm²/mm, the flexible member 30 is in a soft state, and therefore the reinforcing sheet 120 becomes curved at the time of peeling.

On the other hand, when the flexural rigidity of the flexible member 30 per unit width (1 mm) exceeds 40,000 N·mm²/mm, the flexible member 30 is difficult to bend, and therefore it becomes difficult to cause bending deformation in the reinforcing sheet 120.

The material of the specification portion 34 has no particular restriction so long as the flexural rigidity of the flexible member 30 per unit width (mm) is from 1,000 N·mm²/mm to 40,000 N·mm²/mm, and examples thereof include resin plates, such as a polyvinyl chloride (PVC) resin plate, an acrylic resin plate and a polyacetal (POM) resin plate, and metal plates.

A plurality of pads 40 are fixed to the surface of the flexible member 30 lying opposite to the laminate 100 side. The plurality of pads 40 may be fixed to the flexible member 30 by adsorption or adhesiveness.

Figure 8:
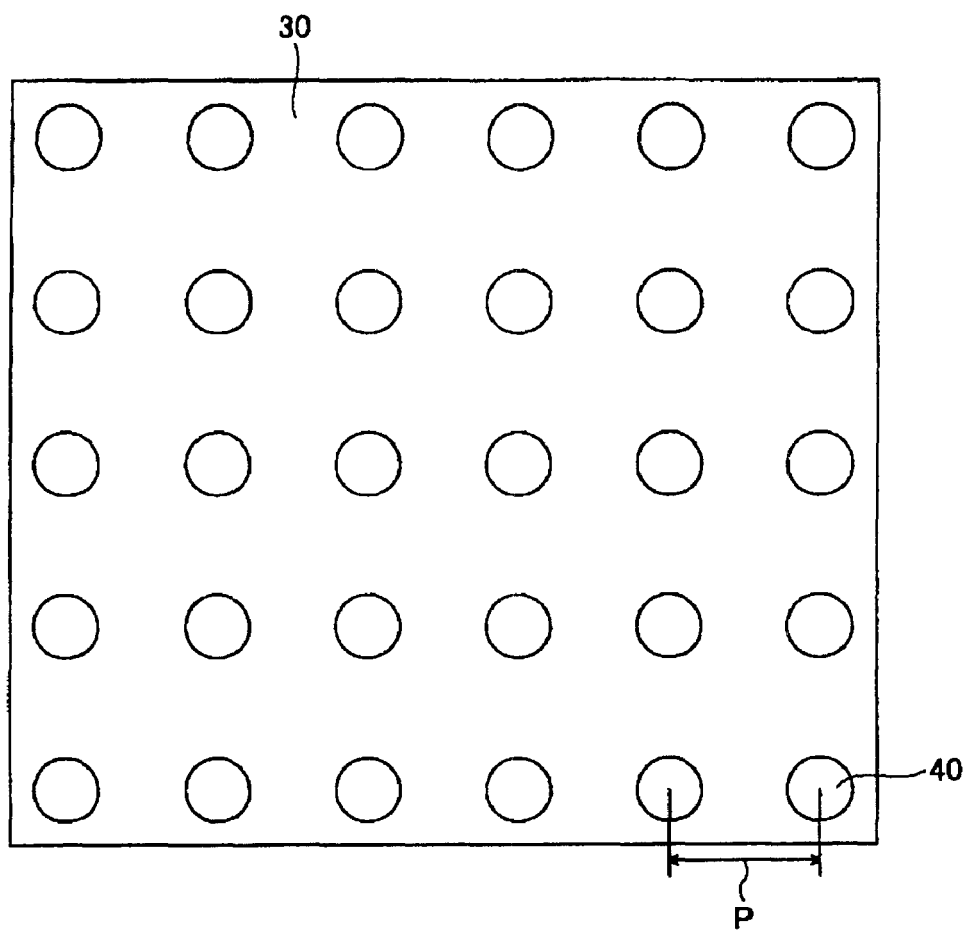
FIG. 8 is a top view showing an example of a pad 40 arrangement.

FIG. 8 is a top view showing an example of an arrangement of the plurality of pads 40.

In the example FIG. 8 shows, the plurality of pads 40 are arranged in a grid with equal pitches (e.g. center-to-center dimension P=98 mm) The size of each pad 40 is set so as not to interfere with bending deformation of the flexible member 30, and each pad in the example shown in FIG. 8 is adjusted to have a diameter of 29 mm.

Additionally, although the arrangement of the plurality of pads 40 in a grid form is adopted in this embodiment, a pad arrangement which can be adopted in the invention is not limited to this one, but the pads may be arranged e.g. with unequal pitches, or they may be arranged in a zigzag.

Each of the plurality of pads 40 is coupled to any one of a plurality of rods 60 via any one of a plurality of joints 50 so that each pad is allowed to be pivotable centering on the vicinity of an intersection point P (within a range of ±15 mm, preferably ±5 mm, from the intersection point P) of the centerline X of the rod coupled thereto and the surface of the reinforcing sheet 120 facing the glass substrate 110 side. Thereby, as shown in FIG. 2, the pad 40 can move in the direction orthogonal to the axis of the rod 60 in the coupled portion between the pad 40 and the rod 60, and can follow bending deformation of the flexible member 30.

Examples of such a joint 50 include spherical joints as shown in FIG. 1 and links. Of these joints, spherical joints of relatively simple structure are preferred.

When a pad 40 and a rod 60 are coupled through a ball joint, the pad 40 cannot move in the direction orthogonal to the axis of the rod 60 in the coupled portion. Thus not only a hindrance to bending deformation of the flexible member 30 but also a hindrance to bending deformation of the second main surface 104 of the laminate 100 occurs in some cases. When the bending deformation of the second main surface 104 of the laminate 100 is small, the reinforcing sheet 120 and the glass substrate 100 are separated in a state of being nearly parallel to each other, and therefore the force for peeling becomes great and it becomes difficult to peel off the reinforcing sheet 120. Because of this, when the reinforcing sheet 120 includes the resin layer 122, and besides, the resin layer 122 and the glass substrate 110 are closely contacted with each other, there is a fear that the resin layer 122 causes aggregation fracture at the time of peeling to result in adhesion of the resin layer 122 to the glass substrate 110.

In contrast to this, the joint 50 used in this embodiment allows each pad 40 to follow bending deformation of the flexible member 30, whereby the reinforcing sheet 120 stuck on the glass substrate 110 can be easily peeled off. Thus, when the reinforcing sheet 120 includes the resin layer 122, and besides, the resin layer 122 and the glass substrate 110 are closely contacted with each other, fractures can be inhibited from occurring at the time of peeling.

In addition, coil springs 52 in a little contracted state are fitted between each pad 40 and the joint 50 mounted thereon. By the resilience of the coil springs 52, wobble in the coupled portion between the pad 40 and the rod 60 can be suppressed.

A plurality of driving devices 70 are devices by which the plurality of rods 60 can be moved toward or away from the stage 10 on an individual basis under control by one control device 80. In other words, the plurality of driving devices 70 are devices for making the plurality of rods 60 elongate or contract in their individual axis directions under control by one control device 80. Each of the driving devices 70 is mounted on any one of rods 60. The driving devices 70 have no particular restriction, but an air cylinder or a servomotor is preferably used as each of the driving devices 70.

The plurality of driving devices 70 are preferably attached to a frame 16 via any of a plurality of cushion members 14. The material of the cushion members 14 has no particular restriction, and examples thereof include urethane rubber. Additionally, the frame 16 can relatively move in an approaching direction to and in a separating direction from the stage 10.

Because the cushion members 14 are interposed between each driving device 70 and the frame 16 as mentioned above, each rod 60 is allowed to slightly incline in the direction orthogonal to its axis, and it becomes easy to make each pad 40 follow bending deformation of the flexible member 30.

A control device 80 includes a microcomputer and so on, and controls the position of each of the plurality of rods 60 relative to the stage 10 on an individual basis. As illustrated in FIG. 2, the control device 80 controls the position of each of the plurality of rods 60 on an individual basis so as to cause a bending deformation in the reinforcing sheet 120 in sequence from the position at which the initial peeling has been carried out (i.e., the position at which the peeling blade 20 has been inserted) in a condition that the glass substrate 110 is supported in a flat state. Thus the positions of the plurality of rods 60 can be adjusted according to e.g. the thickness and kind of an object to be peeled off (a glass substrate 110 or a reinforcing sheet 120) and it becomes possible to easily respond to changes in objects to be peeled off.

As illustrated in FIG. 2, the control device 80 controls the position of each of the plurality of rods 60 on an individual basis so that, in the vicinity of a peeling front 128 which divides the surface of the reinforcing sheet 120 facing the glass substrate 110 side and being deformed by sequential bending into a peeled area 124 and an unpeeled area 126, the peeled area 124 is adjusted to have a curvature radius in a range of 250 mm to 2,500 mm, more preferably 500 mm to 1,000 mm. Herein, the expression of "vicinity of a peeling front 128" used herein refers to the area extending from the peeling front 128 within 50 mm.

When the curvature radius of the peeled area 124 in the vicinity of the peeling front 128 is less than 250 mm, the reinforcing sheet 120 may be fractured to break. Occurrence of the breakage becomes a problem especially when the reinforcing sheet 120 includes a glass sheet 121.

On the other hand, in the vicinity of the peeling front 128, when the curvature radius of the peeled area 124 exceeds 2,500 mm, the reinforcing sheet 120 and the glass substrate 110 are separated in a nearly parallel state, and therefore the force required for peeling becomes great and it becomes difficult to peel off the reinforcing sheet 120. As a result, there occurs detachment of the flexible member 30 from the laminate 100. In addition, when the reinforcing sheet 120 includes the resin layer 122, and besides, the resin layer 122 and the glass substrate 110 are closely contacted with each other, there is a fear that the resin layer 122 causes aggregation fracture at the time of peeling to result in adhesion of the resin layer 122 to the glass substrate 110.

In the peeled area 124 other than the vicinity of the peeling front 128, the reinforcing sheet 120 has no particular restriction on its shape so long as it is fractured to break. For instance, it may have the shape of a plane.

When servomotors are used as driving devices 70, the control device 80 has a position detecting section 82 and a control section 84 as illustrated in FIG. 1 and FIG. 2. The position detecting section 82 detects a present position of each of the plurality of rods 60 on an individual basis by the rotation number of a servomotor mounted on each individual rod 60. The control section 84 controls the amount of electricity supplied to each servomotor on an individual basis so that the present position detected by the position detecting section 82 is brought near to a predetermined target position. Herein, the target positions vary from rod 60 to rod 60 with time T that has elapsed since the control started, and those recorded in advance on a recording medium for each rod 60 are read out and made available for use. And the time T is detected by a timer or the like incorporated into the control device 80.

In this manner, the control device 80 can control with accuracy not only the position of each of the plurality of rods 60 on an individual basis but also the positions of the plurality of rods 60 in correlation between adjacent rods. As a result, the moving speed of the peeling front 128 on the reinforcing sheet 120 can be kept constant.

Since a variation in moving speed of the peeling front 128 causes a change in force required for peeling, there may be cases where an excessive load is imposed locally on the reinforcing sheet 120.

In addition, when servomotors are used as the driving devices 70, the control device 80 may further have a load detecting section 86 as illustrated in FIG. 1 and FIG. 2. The load detecting section 86 detects load torque of each of the plurality of servomotors (e.g. current supplied to each of the plurality of servomotors). In this case, the control section 84 makes individual amendment to each of the target positions of the plurality of rods 60 on the basis of the detection results in the load detecting section 86, and records the amendments on the recording medium. For instance, when the load torque of one servomotor exceeds the threshold value under the nth time control (in which n is a natural number of 1 or more), the time T at the target position of the rod 60 which is made to move by the one servomotor is amended to be delayed by a specified time (e.g. 0.06 second), and the amended value is recorded on the recording medium. In the case of (n+1)th time control, the amount of electricity supplied to each of the plurality of servomotors is controlled on the basis of the target positions amended and recorded after the nth time control instead of the target positions used under the nth time control. Thereby, it becomes possible to inhibit an excessive load from being imposed on the reinforcing sheet 120 under the (n+1)th time control, and damage to the reinforcing agent 120 can be reduced.

Then, a method for peeling by the foregoing peeling device is described.

The laminate 100 shown in FIG. 5 is mounted on the stage 10 so that the reinforcing sheet 120A is situated on the top and is vacuum-adsorbed to the stage 10. In this situation, the flexible member 30 in the shape of a plate is pressed down on the reinforcing sheet 120A by lowering the frame 16 capable of moving up and down toward the stage 10. Thereafter, the frame 16 is brought to a stop, and the reinforcing sheet 120A is vacuum-adsorbed to the flexible member 30. In this situation, the flexible member 30 is in a planar state as shown in FIG. 1.

Under conditions shown in FIG. 1, initial peeling is commenced by inserting a peeling blade 20 between the reinforcing sheet 120A of the laminate 100 and the glass substrate 110A. Subsequently thereto, as illustrated in FIG. 2, a plurality of rods 60 are moved on an individual basis, whereby the flexible member 30 is subjected to sequential bending deformation from one-end side and the reinforcing sheet 120A is also subjected to sequential bending deformation from the one-end side (the position for the initial peeling). In this manner, the reinforcing sheet 120A is peeled in its entirety off the glass substrate 110A.

At the time of execution of the overall peeling, the peeling operation is conducted so that the peeled area in the vicinity of a peeling front of the reinforcing sheet 120A has a curvature radius in a range of 250 mm to 2,500 mm, more preferably 500 mm to 1,000 mm. Thereby, the peeling can be easily performed, and damage from the peeling can be suppressed.

After the reinforcing sheet 120A is peeled off, the frame 16 is made to rise to the given position, the vacuum adsorption by the flexible member 30 is released, and then the reinforcing sheet 120A is taken off. On the other hand, the resulting laminate 100 is taken off after releasing the vacuum adsorption by the stage 10.

Subsequently thereto, the laminate 100 from which the reinforcing sheet 120A has been peeled off is mounted on the stage 10 so that the reinforcing sheet 120B is situated on the top and vacuum-adsorbed to the stage 10, and then the reinforcing sheet 120B is peeled off the glass substrate 110B by sequential bending deformation from the one-end side (the position for initial peeling) in the same manner as mentioned above.

Thus the reinforcing sheets 120A and 120B can be easily peeled off from the laminate 100, and besides, damage from the peeling can be suppressed.

The reinforcing sheet 120 is peeled off by sequential bending deformation from one-end side in this embodiment, but the invention is not limited to this style of peeling. For instance, the reinforcing sheet 120 may be peeled off by sequential bending deformation from both ends thereof.

Incidentally, although the peeling device in this embodiment is designed so that the stage 10 is fixed and the frame 16 moves up and down, it may be designed so that the stage 10 moves up and down and the frame 16 is fixed, or it may be designed so that both the stage 10 and the frame 16 move up and down. The essential thing is to design to move the stage 10 and the frame 16 relatively.

Second Embodiment

Figure 9:
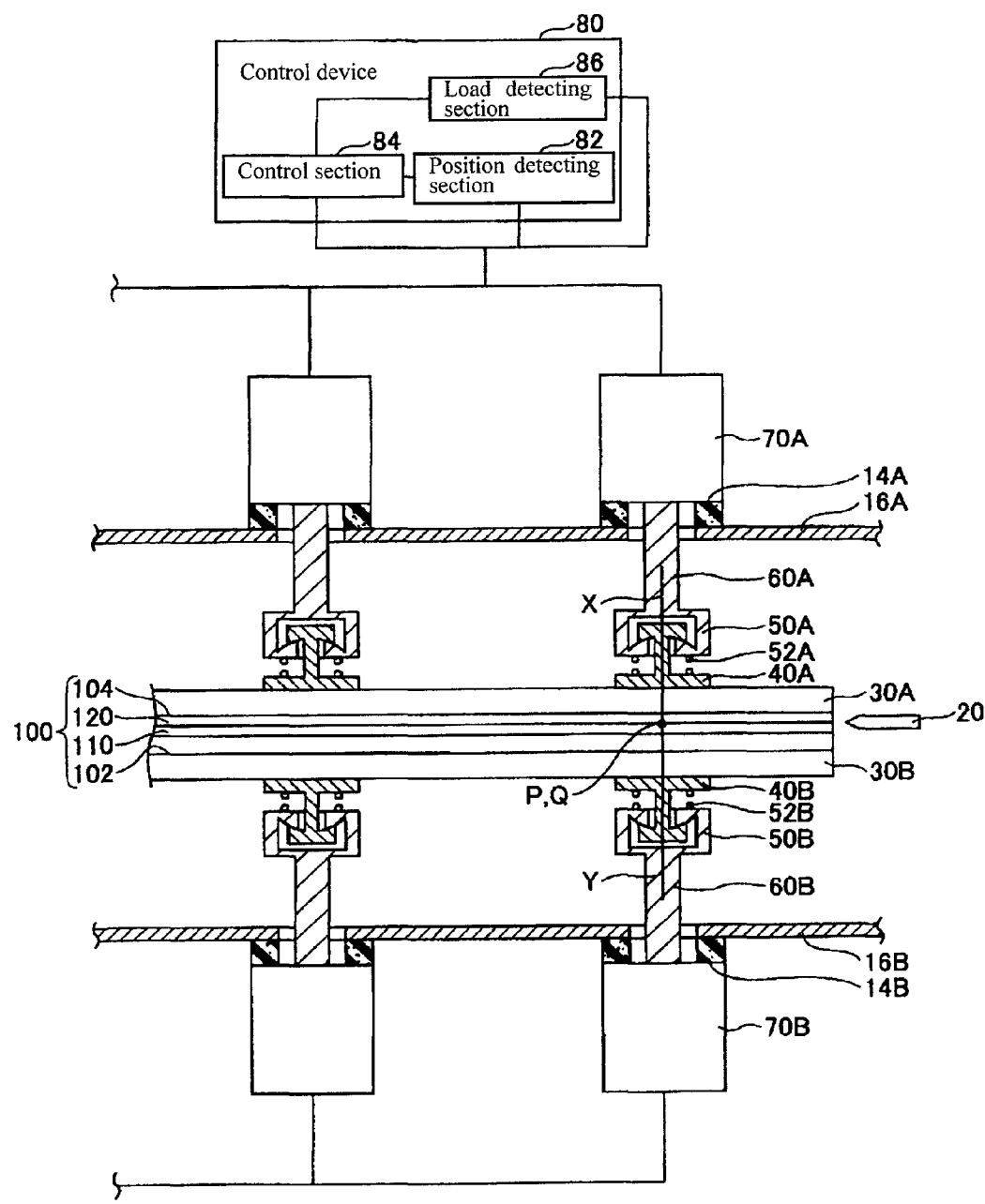
FIG. 9 is a partial cross-sectional side view showing a peeling device in a second embodiment of the invention.

FIG. 9 is a partial cross-sectional side view showing a peeling device in a second embodiment. And FIG. 10 is a partial cross-sectional side view illustrating movements in the peeling device of FIG. 9.

In the first embodiment, a plate-shaped flexible member 30, a plurality of pads 40, a plurality of rods 60, a plurality of driving devices 70 and so on are placed on one side of a laminate 100.

In contrast to this placement, the peeling device in the second embodiment has a configuration that a plate-shaped flexible member 30, a plurality of pads 40, a plurality of rods 60, a plurality of driving devices 70 and so on are placed on either side of a laminate 100.

Figure 10:
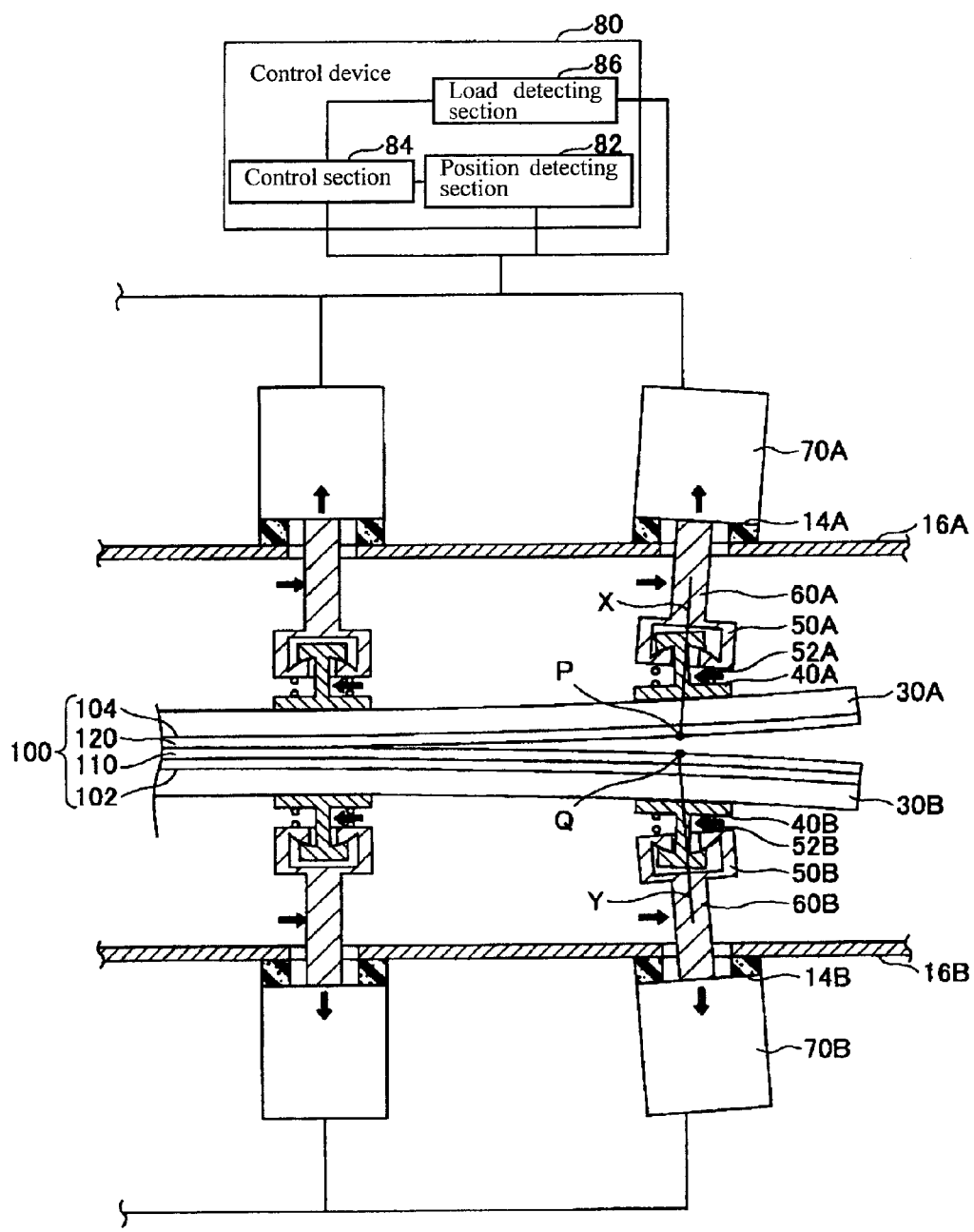
FIG. 10 is a partial cross-sectional side view illustrating movements in the peeling device of FIG. 9.

More specifically, the peeling device in this embodiment has, as illustrated in FIG. 9 and FIG. 10, a configuration that, on one side of the laminate 100, a plate-shaped flexible member 30A, a plurality of pads 40A, a plurality of rods 60A, a plurality of driving devices 70 and so on are placed and, on the other side of the laminate 100, a plate-shaped flexible member 30B, a plurality of pads 40B, a plurality of rods 60B, a plurality of driving devices 70B and so on are placed.

The flexible member 30A is a member to be attached to one main surface 104 of the laminate 100. On the other hand, the flexible member 30B is a member to be attached to the other main surface 102 of the laminate 100.

The plurality of pads 40A are fixed to the surface of the flexible member 30A lying opposite to the laminate 100 side. On the other hand, the plurality of pads 40B are fixed to the surface of the flexible member 30B lying opposite to the laminate 100 side.

Each of the plurality of pads 40A is coupled to any one of the plurality of rods 60A via any one of a plurality of joints 50A so that each pad is allowed to be pivotable centering on the vicinity of an intersection point P of the centerline X of the rod 60A coupled thereto and the surface of the reinforcing sheet 120 facing the glass substrate 110 side. On the other hand, each of the plurality of pads 40B is coupled to any one of the plurality of rods 60B via any one of a plurality of joints 50B so that each pad is allowed to be pivotable centering on the vicinity of an intersection point Q of the centerline Y of the rod 60B coupled thereto and the surface of the glass substrate 110 facing the reinforcing sheet 120 side.

In addition, coil springs 52A in a little contracted state are fitted between each pad 40A and the joint 50A mounted thereon. By the resilience of the coil springs 52A, wobble in the portion of coupling between the pad 40A and the rod 60A can be eliminated. On the other hand, coil springs 52B in a little contracted state are fitted in between each pad 40B and the joint 50B mounted thereon. By the resilience of the coil springs 52B, wobble in the portion of coupling between the pad 40B and the rod 60B can be suppressed.

The plurality of driving devices 70A are devices for making the plurality of rods 60A elongate and contract in their individual axis directions under control by one control device 80. Each of the driving devices 70A is mounted on any one of rods 60A. Each of the driving devices 70A is attached to a frame 16A via any of a plurality of cushion members 14A. On the other hand, the plurality of driving devices 70B are devices for making the plurality of rods 60B elongate and contract in their individual axis directions under control by one control device 80. Each of the driving devices 70B is mounted on any one of rods 60B. Each of the driving devices 70B is attached to a frame 16B via any of plural cushion members 14B.

The control device 80 includes a microcomputer and so on, and controls not only the position of each of the plurality of rods 60A on an individual basis but also the position of each of the plurality of rods 60B on an individual basis. As illustrated in FIG. 9 and FIG. 10, the control device 80 not only controls the position of each of the plurality of rods 60A on an individual basis so as to cause a bending deformation in the reinforcing sheet 120 in sequence from the position at which the initial peeling has been carried out (i.e., the position at which the peeling blade 20 has been inserted) but also controls the position of each of the plurality of rods 60B on an individual basis so as to cause a bending deformation in the glass substrate 110 in sequence from the position at which the initial peeling has been carried out. Thus the glass substrate 110 and the reinforcing sheet 120 are separated by bending deformation in directions opposite to each other. Incidentally, the glass substrate 110 and the reinforcing sheet 120 may be subjected to bending deformations which are almost symmetrical to each other, or they may be subjected to bending deformations which are asymmetrical.

By the way, when the extent of bending deformation is great, there is a possibility that the glass substrate 110 and the reinforcing sheet 120 are fractured to break. On the other hand, when the extent of bending deformation is small, the glass substrate 110 and the reinforcing sheet 120 are separated in a state of being almost parallel to each other, and therefore the force required for peeling becomes great and the peeling becomes difficult to perform.

In this embodiment, because both the glass substrate 110 and the reinforcing sheet 120 are subjected to bending deformation in directions opposite to each other at the time of execution of peeling, they resist being almost parallel to each other as compared with cases where one of them is held flat and the other is subjected to bending deformation. Therefore, effective reduction in damage and lowering of force for peeling can be attained.

In the case where the glass substrate 110 and the reinforcing sheet 120 are subjected to bending deformation almost symmetrically at the time of execution of peeling, effective reduction in damage can be achieved as the force for peeling is kept equivalent by setting the curvature radius of the peeled area at almost twice as large as that in the case where one of the glass substrate 110 and the reinforcing sheet 120 is held flat and the other is subjected to bending deformation.

Also, in the case where the glass substrate 110 and the reinforcing sheet 120 are subjected to bending deformation almost symmetrically, the force for peeling can be reduced as the reduction in damage is kept equivalent by setting the curvature radius of the peeled area at almost the same value as in the case where one of the glass substrate 110 and the reinforcing sheet 120 is held flat and the other is subjected to bending deformation.

Then, a peeling method using the peeling device is described.

FIGS. 11(a) to 11(f) are process drawings illustrating a peeling method in the second embodiment.

Figure 11A:
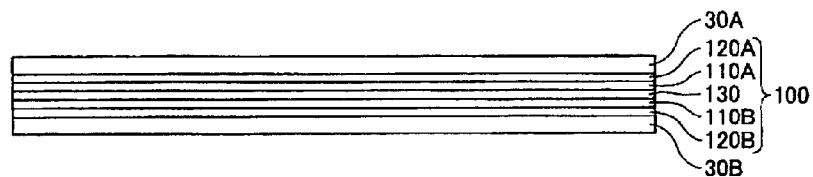
FIGS. 11(a) to 11(f) are process drawings illustrating a peeling method in the second embodiment of the invention.

The laminate 100 shown in FIG. 5 is mounted on the plate-shaped flexible member 30B so that the reinforcing sheet 120A is situated on the top, and subjected to vacuum adsorption. In this state, the plate-shaped flexible member 30A is pressed down on the reinforcing sheet 120A by lowering the frame 16A capable of moving up and down toward the frame 16B. Thereafter, the frame 16A is brought to a stop, and the reinforcing sheet 120A is vacuum-adsorbed to the flexible member 30A. In this situation, the flexible member 30A and the flexible member 30B are in a planar state as shown in FIG. 11(a).

Figure 11B:
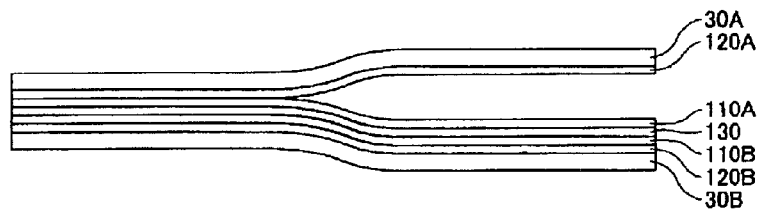
Figure 11C:
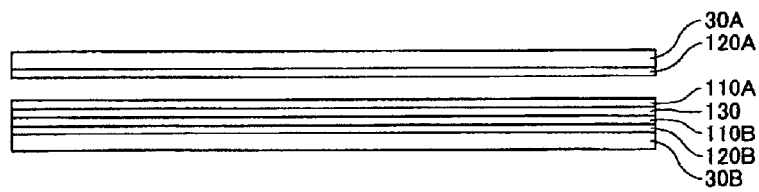

Subsequently, initial peeling is carried out by inserting the peeling blade 20 between the reinforcing sheet 120A of the laminate 100 and the glass substrate 110A. Thereafter, as illustrated in FIG. 11(b) and FIG. 11(c), the flexible member 30A is subjected to sequential bending deformation from one-end side and the reinforcing sheet 120A is also subjected to sequential bending deformation from the one-end side (the position at which the initial peeling has been carried out). At the same time, the flexible member 30B is subjected to sequential bending deformation from the one-end side and the glass substrate 110A is also subjected to sequential bending deformation from the one-end side (the position at which the initial peeling has been carried out). Thus, the reinforcing sheet 120A is peeled in its entirety off the glass substrate 110A.

Figure 11D:
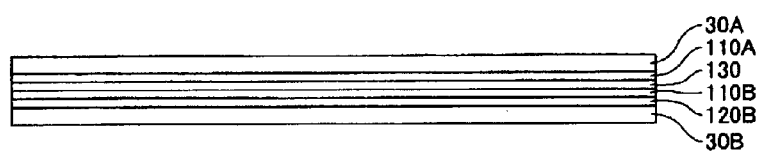

After the peeling of the reinforcing sheet 120A, the frame 16A is made to rise to the given position, the vacuum adsorption by one of the flexible members, namely the flexible member 30A, is released, and then the reinforcing sheet 120A is taken off. Subsequently thereto, the flexible member 30A is made to move down and pressed against the glass substrate 110A. Then the glass substrate 110A is vacuum-adsorbed to the flexible member 30A. In this situation, as shown in FIG. 11(d), the flexible member 30A and the flexible member 30B are in a planar state.

Figure 11E:
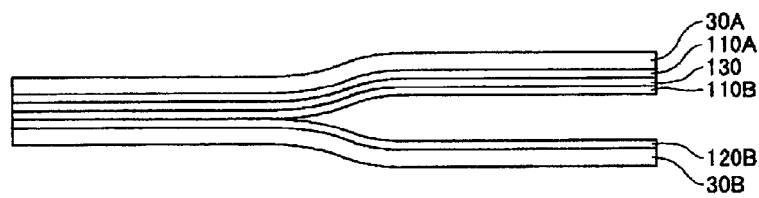
Figure 11F:
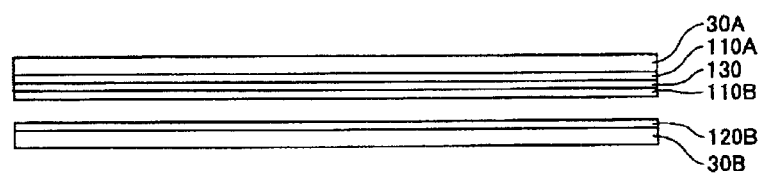

In the next place, initial peeling is carried out by inserting the peeling blade 20 between the reinforcing sheet 120B and the glass substrate 110B. Thereafter, as illustrated in FIG. 11(e) and FIG. 11(f), the flexible member 30 B is subjected to sequential bending deformation from one-end side and the reinforcing sheet 120B is also subjected to sequential bending deformation from the one-end side (the position at which the initial peeling has been carried out). At the same time, the flexible member 30A is subjected to sequential bending deformation from the one-end side and the glass substrate 110B is also subjected to sequential bending deformation from the one-end side (the position at which the initial peeling has been carried out). Thus, the reinforcing sheet 120B is peeled in its entirety off the glass substrate 110B.

Thus the reinforcing sheets 120A and 120B can be easily peeled off from the laminate 100, and the damage from peeling can be reduced.

Incidentally, though the peeling device in this embodiment is designed so that the frame 16B is fixed and the frame 16A moves up and down, it may be designed so that the frame 16B moves up and down and the frame 16A is fixed, or it may be designed so that both the frame 16B and the frame 16A move up and down. The essential thing is to design to move the flame 16B and the frame 16A relatively.

Third Embodiment for Carrying Out the Invention

In a third embodiment, although the peeling is carried out using the peeling device illustrated in FIG. 9, the peeling device operates in a manner different from the foregoing.

FIG. 12 including (a) to (f) is a process drawing illustrating a peeling method in the third embodiment.

Figure 12A:
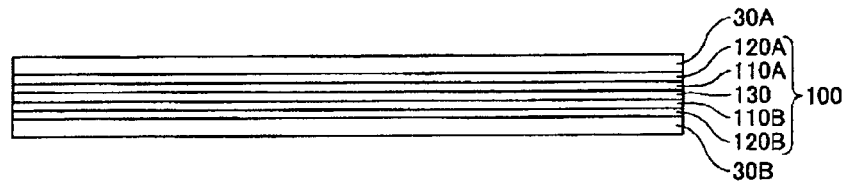
FIGS. 12(a) to 12(f) are process drawings illustrating a peeling method in the third embodiment of the invention.

A laminate 100 shown in FIG. 5 is mounted on a flexible member 30B so that a reinforcing sheet 120A is situated on the top, and subjected to vacuum adsorption. In this state, a plate-shaped flexible member 30A is pressed down on the reinforcing sheet 120A by lowering a frame 16A capable of moving up and down toward a frame 16B. Thereafter, the frame 16A is brought to a stop, and the reinforcing sheet 120A is vacuum-adsorbed to the flexible member 30A. In this situation, the flexible member 30A and the flexible member 30B are in a planar state as shown in FIG. 12(a).

Figure 12B:
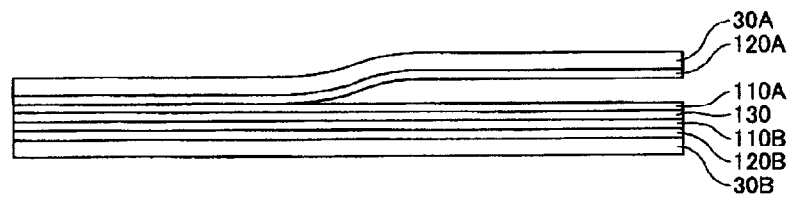
Figure 12C:
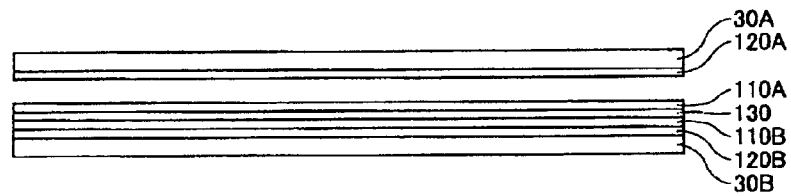

Subsequently, initial peeling is carried out by inserting a peeling blade 20 between the reinforcing sheet 120A of the laminate 100 and a glass substrate 110A. Thereafter, as illustrated in FIG. 12(b) and FIG. 12(c), while the glass substrate 110A is hold flat, the flexible member 30A is subjected to sequential bending deformation from one-end side and the reinforcing sheet 120A is also subjected to sequential bending deformation from the one-end side (the position at which the initial peeling has been carried out), thereby peeling the reinforcing sheet 120A in its entirety off the glass substrate 110A.

At the time of execution of the overall peeling, the peeling operation is conducted so that the peeled area in the vicinity of a peeling front of the reinforcing sheet 120A has a curvature radius in a range of 250 mm to 2,500 mm, preferably 500 mm to 1,000 mm. Thereby, the peeling can be easily performed and damage from the peeling can be suppressed.

Figure 12D:
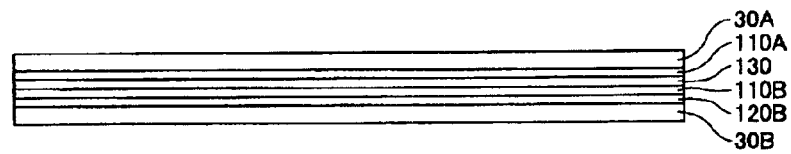

After the reinforcing sheet 120A is peeled off, the flexible member 30A is made to rise to the given position, the vacuum adsorption by the flexible member 30A is released, and then the reinforcing sheet 120A is taken off. Subsequently thereto, the flexible member 30A is made to move down and pressed against the glass substrate 110A. Then the glass substrate 110A is vacuum-adsorbed to the flexible member 30A. In this situation, as shown in FIG. 12(d), the flexible member 30A and the flexible member 30B are in a planar state.

Figure 12E:
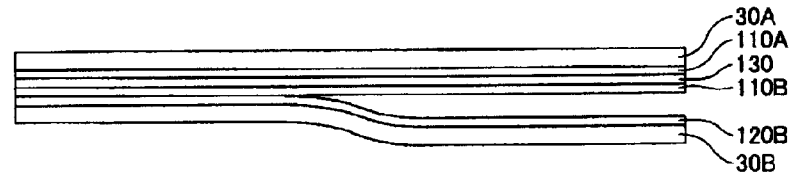
Figure 12F:
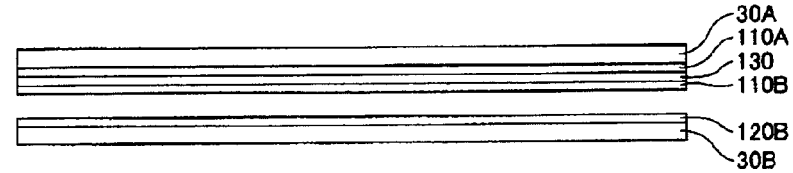

Subsequently, initial peeling is carried out by inserting the peeling blade 20 between the reinforcing sheet 120B and the glass substrate 110B. Then, as illustrated in FIG. 12(e) and FIG. 12(f), while the glass substrate 110B is held flat, the flexible member 30 B is subjected to sequential bending deformation from one-end side and the reinforcing sheet 120B is also subjected to sequential bending deformation from the one-end side (the position at which the initial peeling has been carried out), thereby peeling the reinforcing sheet 120B in its entirety off the glass substrate 110B.

At the time of execution of the overall peeling, the peeling operation is conducted so that the peeled area in the vicinity of a peeling front of the reinforcing sheet 120B has a curvature radius in a range of 250 mm to 2,500 mm, preferably 500 mm to 1,000 mm. Thereby, the peeling can be performed with ease and damage from the peeling can be reduced.

Thus the reinforcing sheets 120A and 120B can be easily peeled off from the laminate 100, and damage from peeling can be suppressed.

Incidentally, the reinforcing sheets 120A and 120B are each peeled off by sequential bending deformation from one-end side in this embodiment, but the invention is not limited to this style of peeling. For instance, the reinforcing sheets 120A and 120B each may be peeled off by sequential bending deformation from both ends thereof.

Incidentally, although the peeling device in this embodiment is designed so that the frame 16B is fixed and the frame 16A moves up and down, it may be designed so that the frame 16B moves up and down and the frame 16A is fixed, or it may be designed so that both the frame 16B and the frame 16A move up and down. The essential thing is to design so that the frame 16B and the frame 16A move relatively.

Up to this point, although the embodiments of the invention have been described, the invention should not be construed as being limited to the described embodiments, and various modifications to and replacements in these embodiments can be made without departing from the scope of the invention.

For instance, although the initial peeling is carried out by use of the peeling blade 20 in the embodiments, the invention is not limited to such a manner. The initial peeling may be carried out e.g. by blowing compressed air or spraying a liquid.

In addition, although the peeling devices in the embodiment are presented as devices for peeling off a reinforcing sheet 120 stuck on a glass substrate 110, the invention is not limited to this use. For example, the peeling device may be a device for peeling off a reinforcing sheet stuck on a substrate such as silicon wafer, a metal substrate or a plastic substrate. The material of a metal substrate has no particular restriction, and examples thereof include stainless steel and copper. The material of a plastic substrate also has no particular restriction. Examples of a transparent resin for the plastic substrate include polyethylene terephthalate resins, polycarbonate resin, polyethersulfone resins, polyethylene naphthalate resins, polyacrylic resins, polysilicone resins and transparent fluoropolymers. Examples of an opaque resin for the plastic substrate include polyimide resins, fluoropolymers, polyamide resins, polyaramide resins, polyetherketone resins, polyetheretherketone resins, and various types of liquid-crystal polymer resins. Of these resins, the resins preferred in view of heat resistance are polyimide resins, fluoropolymers, polyamide resins, polyaramide resins, polyethersulfone resins, polyetherketone resins, polyetheretherketone resins, polyethylene naphthalate resins and various types of liquid-crystal polymer resins. These materials has 300° C. or higher of 5% weight-loss heating temperature, and therefore they make it possible to form thin-film transistors (TFTs) on substrates. The 5% weight-loss heating temperature thereof is preferably 350° C. or higher.

In view of heat resistance, any of the glass substrates fit such a case.

Examples of a resin which is more preferred in terms of heat resistance include polyimide resins, fluoropolymers, polyimide resins, polyaramide resins, polyethersulfone resins, polyetherketone resins, polyetheretherketone resins, polyethylene naphthalate resins and various types of liquid-crystal polymer resins.

Additionally, the substrate may be a laminated substrate made by laminating layers of the same material or different materials selected from glass substrates, silicon wafers, metal plates, plastic substrates or the like. Examples of such a laminated substrate include a laminate of a glass substrate and a plastic substrate, a laminate made by laminating a plastic substrate, a glass substrate and a plastic substrate in order of mention, a laminate of two or more glass substrates or a laminate of two or more plastic substrates.

In the embodiments, although the reinforcing sheet 120 is composed of a glass sheet 121 alone or it is composed of a glass sheet 121 and a resin layer 122 formed thereon, the invention is not limited to such a composition. For instance, a silicon wafer, a metal sheet or a plastic sheet may be used in place of the glass sheet 121. As to the material for the metal sheet, there is no particular restriction, and stainless steel, copper or the like may be used. As to the material for the plastic sheet also, there is no particular restriction, and examples of such a material include polyethylene terephthalate resins, polycarbonate resins, polyimide resins, fluoropolymers, polyamide resins, polyaramide resins, polyethersulfone resins, polyetherketone resins, polyetheretherketone resins, polyethylene naphthalate resins, polyacrylic resins, various types of liquid-crystal polymer resins and polysilicone resins. Of these resins, polyimide resins, fluoropolymers, polyamide resins, polyaramide resins, polyethersulfone resins, polyetherketone resins, polyetheretherketone resins, polyethylene naphthalate resins and various types of liquid-crystal polymer resins are preferable from the viewpoint of heat resistance. These materials has 300° C. or higher of 5% weight-loss heating temperature, and therefore they make it possible to form thin-film transistors (TFTs) on substrates. The 5% weight-loss heating temperature thereof is preferably 350° C. or higher.

EXAMPLES

The invention will now be illustrated concretely by reference to the following examples, but these examples should not be construed as limiting the scope of the invention.

Example 1

Production of Reinforcing Sheet

A 350 mm-long, 300 mm-wide and 0.4 mm-thick glass sheet (AN100, manufactured by Asahi Glass Co., Ltd.) was subjected to alkaline wash, further to ultrasonic cleaning with purified water, and then to drying by 10-minute exposure to 80° C. IPA vapor. To the thus dried glass sheet, a coat of mixture of 100 parts by mass of addition-reaction type liquid silicone (KNS-320A, manufactured by Shin-Etsu Silicones) with 2 parts by mass of platinum catalyst (CAT-PL-56, manufactured by Shin-Etsu Silicones) was applied by means of a spin coater (application quantity: 30 g/m$^2$). Subsequently thereto, the coat was cured by 10-minute heating at 180° C. in the air. Thus a reinforcing sheet composed of the glass sheet and the silicone resin layer was made.

(Sticking of Reinforcing Sheet on Glass Substrate)

A 350 mm-long, 300 mm-wide and 0.3 mm-thick glass substrate (AN100, manufactured by Asahi Glass Co., Ltd.) was subjected to alkaline wash, further to ultrasonic cleaning with purified water, and then to drying by 10-minute exposure to 80° C. IPA vapor. The thus dried glass substrate and the reinforcing sheet were stuck together in a vacuum by a pressing device, whereby the glass substrate and the silicone resin layer were brought into close contact with each other.

(Production of Laminate)

Two sheets of the thus stuck matter made up of the glass substrate and the reinforcing sheet were prepared, and the two glass substrates were adhered together by use of a double-faced tape, thereby producing a laminate. This laminate had a structure in which the reinforcing sheet, the glass substrate, the double-faced tape (adhesive layer), the glass substrate and the reinforcing sheet were stacked on top of each other in order of mention. Incidentally, the adhesive layer is a substitute for the liquid crystal layer 130 shown in FIG. 5.

(Peeling Test)

The laminate produced in the foregoing manner was submitted to a peeling test by use of the peeling device shown in FIG. 1 and FIG. 2. More specifically, the first main surface of the laminate was vacuum-adsorbed to the stage 10, while the second main surface of the laminate was vacuum-adsorbed to the flexible member 30.

Subsequently thereto, initial peeling was carried out by inserting the peeling blade 20 between the reinforcing sheet on the second main surface side of the laminate and the glass substrate, and then a plurality rods 60 were moved on an individual basis, whereby the flexible member 30 was subjected to sequential bending deformation from one-end side thereof and the reinforcing sheet was also subjected to sequential bending deformation from the one-end side thereof (the position at which the initial peeling had been carried out). In this manner, the reinforcing sheet was peeled in its entirety off the glass substrate.

The curvature radius R of the peeled area in the vicinity of a peeling front of the reinforcing sheet is shown in Table 1, together with the test result on the peeling. Additionally, the average moving speed of the peeling front of the reinforcing sheet was set at 0.4 msec.

TABLE 1

| Reinforcing sheet | | Curvature Radius R (mm) | Peel-off Performance |
|---|---|---|---|
| Example 1 | Glass/silicone | 250 | Good (no breakage) |
| Example 2 | Glass/silicone | 1,000 | Good (no breakage) |
| Example 3 | Glass/silicone | 2,500 | Good (no breakage) |
| Example 4 | Glass | 250 | Good (no breakage) |
| Example 5 | Glass | 1,000 | Good (no breakage) |
| Example 6 | Glass | 2,500 | Good (no breakage) |
| Comparative Example 1 | Glass/silicone | 200 | Bad (breakage) |
| Comparative Example 2 | Glass/silicone | 3,000 | Bad (detachment) |
| Comparative Example 3 | Glass | 200 | Bad (breakage) |
| Comparative Example 4 | Glass | 3,000 | Bad (detachment) |

In Example 1, no breakage was noticed in the reinforcing sheet after having undergone the peeling.

Examples 2 and 3 and Comparative Examples 1 and 2

In each of Examples 2 and 3 and Comparative Examples 1 and 2, the laminate was produced and the reinforcing sheet stuck on the glass substrate was peeled off in the same manner as in Example 1, except that the curvature radius R was changed to the condition specified in Table 1. Results obtained are shown in Table 1.

In each of Examples 2 and 3, no breakage was noticed in the reinforcing sheet after having undergone the peeling. On the other hand, the glass sheet incorporated into the reinforcing sheet was broken under the peeling in Comparative Example 1, while in Comparative Example 2 the force for peeling became great to result in detachment of the flexible member 30 from the reinforcing sheet under the peeling.

Examples 4 to 6 and Comparative Examples 3 and 4

In each of Examples 4 to 6 and Comparative Examples 3 and 4, the laminate was produced and the reinforcing sheet stuck on the glass substrate was peeled off in the same manner as in Example 1, except that the glass sheet alone was used as the reinforcing sheet and the curvature radius R was changed to the condition specified in Table 1. Results obtained are shown in Table 1.

Incidentally, the glass sheet used as the reinforcing sheet was a 350 mm-long, 300 mm-wide and 0.4 mm-thick glass sheet (AN100, manufactured by Asahi Glass Co., Ltd.) which had undergone alkaline wash, further ultrasonic cleaning with purified water and then drying by 10-minute exposure to 80° C. IPA vapor.

In each of Examples 4 to 6, no breakage was noticed in the reinforcing sheet after having undergone the peeling. On the other hand, the glass sheet as the reinforcing sheet was broken under the peeling in Comparative Example 3, while in Comparative Example 4 the force for peeling became great to result in detachment of the flexible member 30 from the reinforcing sheet under the peeling.

Example 7

In Example 7, a laminate was produced in the same manner as in Example 3, except that the reinforcing sheet having a 350 mm-long, 300 mm-wide and 0.4 mm-thick glass sheet (AN100, manufactured by Asahi Glass Co., Ltd.) was stuck on a 0.1 mm-thick polyethylene terephthalate resin sheet, and the reinforcing sheet stuck on the polyethylene terephthalate resin sheet was peeled off under the same condition as in Example 3. As a result, no breakage was noticed in the reinforcing sheet after having undergone the peeling.

Example 8

In Example 8, a laminate was made in the same manner as in Example 3, except that the reinforcing sheet having a 350 mm-long, 300 mm-wide and 0.4 mm-thick glass sheet (AN100, manufactured by Asahi Glass Co., Ltd.) was stuck on a 0.1 mm-thick mirror-finished stainless steel substrate (SUS304), and the reinforcing sheet stuck on the stainless steel substrate was peeled off under the same condition as in Example 3. As a result, no breakage was noticed in the reinforcing sheet after having undergone the peeling.

Example 9

In Example 9, a laminate was made in the same manner as in Example 3, except that the reinforcing sheet having a 350 mm-long, 300 mm-wide and 0.4 mm-thick glass sheet (AN100, manufactured by Asahi Glass Co., Ltd.) was stuck on a 0.05 mm-thick polyimide substrate (Kapton 200HV, manufactured by DU PONT-TORAY CO., LTD.), and the reinforcing sheet stuck on the polyimide substrate was peeled off under the same condition as in Example 3. As a result, no breakage was noticed in the reinforcing sheet after having undergone the peeling.

Example 10

In example 10, at the outset, the surface of a 350 mm-long, 300 mm-wide and 0.08 mm-thick glass substrate having a linear expansion coefficient of $38 \times 10^{-7}$/° C. (a non-alkali glass substrate, AN100, manufactured by Asahi Glass Co., Ltd.) was cleaned by carrying out a wash in an alkali detergent by a washer. Further, a 0.1% methanol solution of γ-mercaptopropyltrimethoxysilane was sprayed on the glass substrate surface, and then dried at 80° C. for 3 minutes. The glass substrate thus treated was prepared as a glass film for lamination. On the other hand, a 350 mm-long, 300 mm-wide and 0.05 mm-thick polyimide substrate (Kapton 200HV, manufactured by DU PONT-TORAY CO., LTD.) whose surface had been subjected to plasma treatment was prepared. And the glass film for lamination and the polyimide substrate were superposed on each other and subjected to lamination by use of a pressing device heated to 320° C., thereby preparing a glass-resin laminated substrate.

A laminate was produced in the same manner as in Example 3, except that the reinforcing sheet having a 350 mm-long, 300 mm-wide and 0.4 mm-thick glass sheet (AN100, manufactured by Asahi Glass Co., Ltd.) was stuck on the resin surface of the glass-resin laminated substrate, and the reinforcing sheet stuck on the glass-resin laminated substrate was peeled off from the laminate under the same condition as in Example 3. As a result, no breakage was noticed in the reinforcing sheet after having undergone the peeling.

While the invention has been described in detail and with reference to specific embodiments thereof, it will be apparent to one skilled in the art that various changes and modifications can be made therein without departing from the spirit and scope of the invention.

This application is based on Japanese Patent Application No. 2009-200914 filed on Aug. 31, 2009, the entire contents of which are incorporated herein by reference.

INDUSTRIAL APPLICABILITY

The invention can provide peeling devices which each allow a reinforcing sheet stuck on a substrate to be easily peeled off, and besides, which each can easily respond to changes in objects to be peeled off.

DESCRIPTION OF REFERENCE NUMERALS

10 Supporting unit (Stage)
20 Peeling blade
30 Flexible member
32 Attachment portion
34 Specification portion
40 Pad
50 Spherical joint
60 Rod
70 Driving device
80 Control device
100 Laminate
110 Glass substrate
120 Reinforcing sheet
121 Glass sheet
122 Resin layer
124 Peeled area
126 Unpeeled area
128 Peeling front

The invention claimed is:

1. A peeling device which peels off a reinforcing sheet stuck on a substrate, comprising:
a supporting unit which supports a first surface of a laminate having the first surface and a second surface, wherein the laminate comprises a substrate and a reinforcing sheet;
a plate-shaped flexible member which is attachable to a second surface of the laminate;
a plurality of pads fixed to a surface of the plate-shaped flexible member, wherein said flexible member is lying opposite to the first surface of the laminate;
a plurality of rods each of which is coupled to any one of the plurality of pads;
a plurality of driving devices by which the plurality of rods are made to move in individual axial directions relative to the other rods; and
a control device by which a position of each of the plurality of rods is controlled on an individual basis,
wherein each of the plurality of pads is coupled to any one of the plurality of the rods via any one of a plurality of joints so that each pad is allowed to pivot, wherein the plurality of pads pivot around an intersection point of a centerline of the rod coupled thereto with either a surface of the reinforcing sheet facing the first surface of a laminate or a surface of the substrate facing the reinforcing sheet, and
wherein the first surface of the laminate is supported by the supporting unit, and at the same time, the position of each of the plurality of rods is controlled by the control device so that the second surface of the laminate is subjected to bending deformation starting from a terminal side of the second surface of the laminate.

2. The peeling device according to claim 1, wherein each of the plurality of joints is a spherical joint.

3. The peeling device according to claim 1, wherein the plurality of driving devices are attached to one frame via any of a plurality of cushion members.

4. The peeling device according to claim 1, wherein the driving device is a servomotor.

5. The peeling device according to claim 1, wherein the flexible member includes an attachment portion to be attached to the second surface of the laminate in a detachable condition and a portion that imparts a flexural rigidity of the flexible member.

6. The peeling device according to claim 5, wherein the attachment portion comprises rubber.

7. The peeling device according to claim 1, wherein the reinforcing sheet includes at least a glass sheet.

8. The peeling device according to claim 1, wherein a member for an electronic device is formed on the substrate lying opposite to the reinforcing sheet.

9. A peeling device which peels off a reinforcing sheet stuck on a substrate, comprising:
a first plate-shaped flexible member which is attachable to a first surface of a laminate having the first surface and a second surface, wherein the laminate comprises a substrate and a reinforcing sheet,
a second plate-shaped flexible member which is attachable to the second surface of the laminate;
a plurality of pads fixed to a surface of both the first plate-shaped flexible member and the second plate-shaped flexible member;
a plurality of rods each of which is coupled to any one of the plurality of pads;
a plurality of driving devices by which the plurality of rods are made to move in individual axial directions relative to the other rods; and
a control device by which a position of each of the plurality of rods is controlled on an individual basis,
wherein each of the plurality of pads is coupled to any one of the plurality of the rods via any one of a plurality of joints so that each pad is allowed to pivot, wherein the plurality of pads pivot around of an intersection point of a centerline of the rod coupled thereto with either a surface of the reinforcing sheet facing the first surface of a laminate or a surface of the substrate facing the reinforcing sheet, and
wherein the position of each of the plurality of rods is controlled by the control device so that the first surface of the laminate is subjected to bending deformation starting from a terminal side of the first surface of the laminate, and the position of each of the plurality of rods is controlled by the control device so that the second surface is subjected to bending deformation starting from a terminal side of the second surface of the laminate.

10. The peeling device according to claim 9, wherein each of the plurality of joints is a spherical joint.

11. The peeling device according to claim 9, wherein the plurality of driving devices are attached to one frame via any of a plurality of cushion members.

12. The peeling device according to claim 9, wherein the driving device is a servomotor.

13. The peeling device according to claim 9, wherein both the first plate-shaped flexible member and the second plate-shaped flexible member comprise
an attachment portion to be attached to the first surface and second surface of the laminate, respectively, in a detachable condition, and a portion that imparts a flexural rigidity of the flexible member.

14. The peeling device according to claim 13, wherein the attachment portion comprises rubber.

15. The peeling device according to claim 9, wherein the reinforcing sheet includes at least a glass sheet.

16. The peeling device according to claim 9, wherein a member for an electronic device is formed on the substrate lying opposite to the reinforcing sheet.

* * * * *